United States Patent
Brady et al.

[19]

[11] Patent Number: 5,966,627
[45] Date of Patent: *Oct. 12, 1999

[54] IN-SITU DOPED SILICON LAYERS

[75] Inventors: David C. Brady, Windermere; Yaw Samuel Obeng, Orlando, both of Fla.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/705,936

[22] Filed: Aug. 30, 1996

[51] Int. Cl.⁶ .................................................. H01L 21/22
[52] U.S. Cl. ......................... 438/542; 438/543; 438/488; 438/297; 438/778
[58] Field of Search ..................... 148/DIG. 60; 438/488, 438/778, 297, 542, 543, 369, 923

[56] References Cited

U.S. PATENT DOCUMENTS

| | | | |
|---|---|---|---|
| 4,217,375 | 8/1980 | Adams | 438/784 |
| 4,460,416 | 7/1984 | Wonsowicz | 438/488 |
| 4,696,833 | 9/1987 | Monnig et al. | 438/778 |
| 4,914,052 | 4/1990 | Kanai | 438/488 |
| 5,096,856 | 3/1992 | Freeman et al. | 438/488 |
| 5,124,272 | 6/1992 | Saito et al. | 438/297 |
| 5,250,463 | 10/1993 | Mikata et al. | 438/488 |
| 5,260,236 | 11/1993 | Petro et al. | 438/786 |
| 5,262,356 | 11/1993 | Fujii | 438/488 |
| 5,326,723 | 7/1994 | Petro et al. | 438/685 |
| 5,352,615 | 10/1994 | Limb et al. | 148/DIG. 60 |
| 5,362,684 | 11/1994 | Saito et al. | 438/488 |
| 5,686,349 | 11/1997 | Nakata | 438/488 |
| 5,700,520 | 12/1997 | Beinglass | 427/255.1 |
| 5,863,598 | 1/1999 | Venkatesan et al. | 427/97 |

Primary Examiner—Carl Whitehead, Jr.
Assistant Examiner—Khanh Duong
Attorney, Agent, or Firm—William S. Francos; Anthony Grillo; John T. Rehberg

[57] ABSTRACT

A method and apparatus for the manufacture of integrated circuits including the placement of a single tube for introduction of dopant gases into a process chamber is disclosed.

5 Claims, 2 Drawing Sheets

IN-SITU DOPED SILICON LAYERS

TECHNICAL FIELD

This invention relates to methods and apparatus for the formation of integrated circuits.

BACKGROUND OF THE INVENTION

Modem integrated circuits often use in-situ doped silicon layers. The silicon layers may be either amorphous silicon or polysilicon. Such doped films are used extensively in Linear CMOS integrated circuits both as high quality resistors, and as the bottom plates for capacitors. In-situ doped polysilicon films are very attractive because, for example, thermal oxides grown on in-situ phosphorus doped polysilicon films are known to exhibit higher breakdown fields, and less leakage than similar oxides grown on ex-situ phosphorus doped polysilicon films (e.g., films doped at temperatures around 900–1000° C. from $PBr_3$ vapors). Also, it is possible to obtain lower polysilicon film resistivity on in-situ doped films than on ex-situ doped films because of the uniform and intimate mixing dopants with the silicon matrix. Typically, in-situ doped silicon layers are formed by combining silane and a dopant-containing gas, such as $PH_3$ in a furnace.

FIG. 1 is a diagram useful in understanding some aspects of the current process. In FIG. 1, reaction furnace 11 is illustratively, a reaction furnace made by BTI, Incorporated, Bruce Technologies International Inc., 25 Esquire Rd., North Billerica, Mass. Reference numeral 13 denotes a heating apparatus which heats the interior of furnace 11. Reference numeral 23 denotes six-caged wafer boats, each boat being filled with 26 wafers loaded proximately back to back. A gas mixture is typically admitted to the furnace through opening 19 at the front of the furnace and through tube 15 which extends 44 inches into the center of the furnace and is positioned below the center of the wafer load (between boats 3 and 4) and also through tube 17 which extends approximately 34 inches into furnace 11. Tubes 19, 15, and 17 are each connected to gas cabinet 21 which supplies either nitrogen, silane, or phosphine through a series of valves and mass-flow controllers denoted by reference numeral 24.

Conventional processing sequences follow the teachings of Wonsowicz in U.S. Pat. No. 4,460,416 issued Jun. 17, 1984. Wonsowicz teaches that both the $PH_3$ and silane gases should be turned on at the same time and gradually increased from zero to respective steady state values. After the layer of doped polysilicon has been formed, the system is purged with nitrogen. The nitrogenpurged step eliminates the hazardous gases from the system tubing.

Those concerned with the development of integrated circuit processing have continually sought better methods and apparatus for the formation of in-situ doped silicon films.

SUMMARY OF THE INVENTION

Illustratively, the present invention addresses these concerns by providing an apparatus and, method for the fabrication of integrated circuits having no more than one tube extending into the chamber for the delivery of dopant gas.

DETAILED DESCRIPTION

Applicant has discovered that the previously-used practices and apparatus can pose a variety of problems to those involved in integrated circuit manufacturing.

Figure 1:
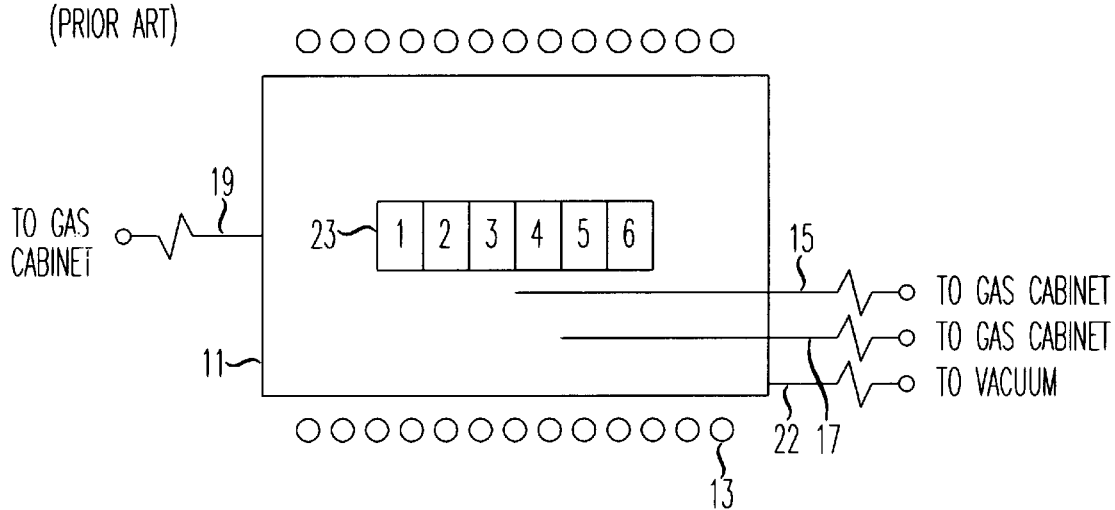
FIGS. 1, 2 and 3 are diagrams which are useful in understanding illustrative embodimets of the present, invention.
Figure 2:
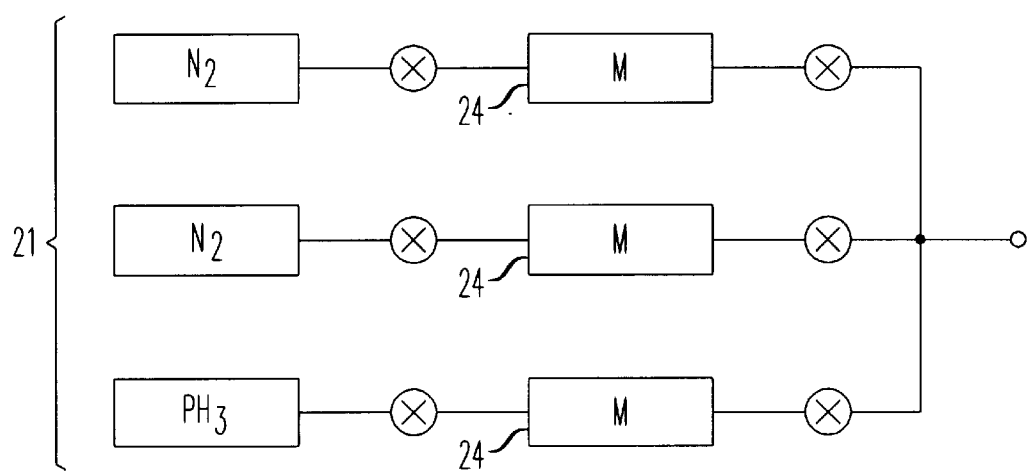
Figure 3:
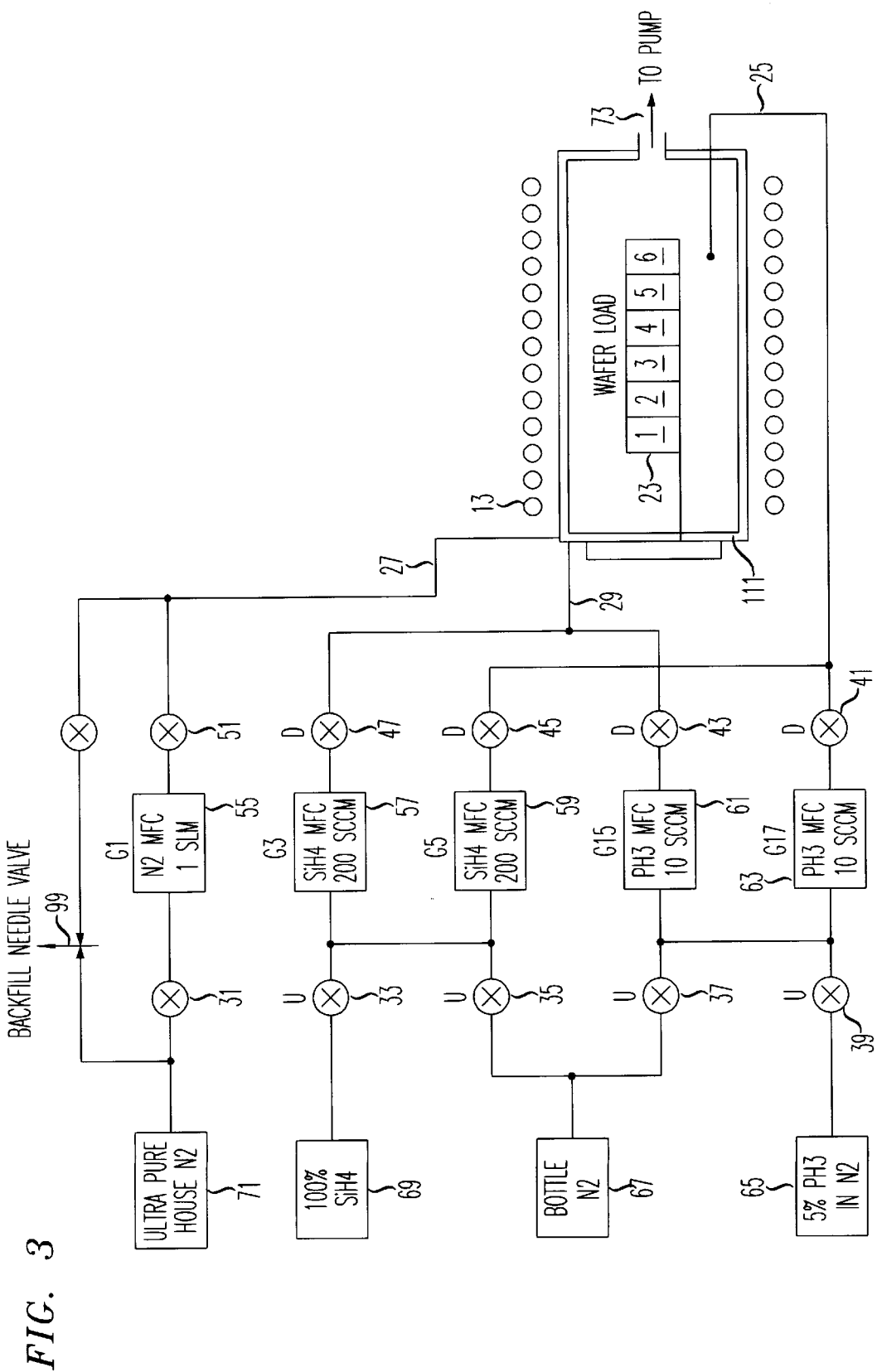

The apparatus of FIG. 3 is an improved apparatus for the formation of in-situ doped silicon. In contrast to the apparatus of FIG. 1, the apparatus of FIG. 3 denoted by reference numeral 111 has only two means for delivering the reactant gases. Tube 29 provides delivery of reactant gases through the front door of chamber 111 (on the left of chamber 111). Tube 29 does not extend into the chamber 111. Tube 25 which extends 34" into the right end of chamber 111 provides a second conduit for delivery of reactant gases. Tube 15 of FIG. 1 has been eliminated. Heating element 13 creates a hot zone within the interior of chamber 111. The center of the hot zone is approximately 42½ inches from the door (on left side) of chamber 111. The wafer load, consisting of 6 boats formerly approximately centered within the hot zone of heaters 13, is moved slightly rearward by 5½ inches. Tube 25 extends only 6 inches into the hot zone of chamber 111. By contrast, tube 15 of FIG. 1 extended 16 inches into the hot zone. Removal of tube 15 and shifting of the wafer load slightly to the rear of the furnace helps to reduce the number of particles which form on the wafers. The presence of tube 15 which extended a substantial distance into the hot zone of the furnace tended to cause excess particles. Silicon tended to deposit within tube 15 and upon the exterior surfaces of tube 15. Consequently, elimination of tube 15 meant the elimination of multiple surfaces conducive to gas phase nucleation. The distance between the center of the six-boat wafer load and the end of tube 25 of FIG. 2 is four inches. The distance between the front of boat 1 and the front door of chamber 111 (on the left) is 33 inches. Reasonable tolerances on the placement of the tube and the wafer boat are ±10%. The overall length of commercially available chamber 111 is 84 inches.

The wafers are loaded into the caged wafer boats and placed into the furnace. Silane gas flow is commenced by opening valves 47 and 45 and 33 for approximately 30 seconds. A thin film of 7–8 Å of silicon is deposited upon the wafers. The temperature of the interior chamber 111 is 500° C.–650° C., depending upon film characteristics required. After a stable silane flow has been established, phosphine is added by opening valves 39, 43, and 41. Proper gas flow is achieved through mass flow controllers 57, 59, 61, and 63.

After the appropriate amount of doped amorphous or polysilicon has been deposited (typically, 2000 Å) the chamber is evacuated via vacuum pump 73. Then the chamber is backfilled with nitrogen by opening valve 99. The rest of the lines are filled with nitrogen by opening valves 37 and 35 and 45 and 43 and 41, and 47. Thus, after a load of wafers has been processed, the system is evacuated, purged with $N_2$ and then backfilled with nitrogen.

Phosphine is an extremely toxic gas, and the reactor must be cycle-purged with inert gases (e.g., nitrogen) at the end of the film deposition process, and before the furnace is opened to atmosphere. In this process $N_2$ is trapped in the gas lines, upstream of the $PH_3$ mass flow controllers, at the end of the purge cycle. The volume of trapped nitrogen depends on a number of external variables, such as the pressure/volume of gas in the source cylinder, and the number of gas lines connected to the source cylinder.

When it is desired to process another wafer load, the wafer boats are loaded into the chamber as before. In the past, after the chamber was brought to the appropriate temperature and silane and phosphine were sources were simply turned on via the appropriate valves. However, nitrogen in the delivery tubes which was present as a result of the previous purge step tended to dilute the first flow of the reactant gases, silane and phosphine. When a new deposition cycle is initiated, the trapped nitrogen dilutes the phosphine, and alters the effective silane-nitrogen ratio. It takes about 25 minutes to displace all of the nitrogen in the gas lines. Thus, the film deposited in the first 25 minutes of the deposition cycle is not uniformly doped, but has an inherent concentration dopant concentration gradient. The dopant concentration gradient in the bottom strata of the doped films results in loss of effective control over such desired film properties as doping, resistivity, and grown oxide uniformities.

Thus, the initial portion of the deposited film tended to be uneven in quality. Consequently, in the present inventive approach, before the silane and phosphine are admitted into the chamber, the chamber is pumped down via pump 73 with valves 41 and 45 open. The trapped nitrogen between valve sets 33, 35, 45, 47 and 37, 39, 43 and 41 is evacuated directly into the process chamber which is pumped out by pump 73. After a 20–25 minute purge and pumpdown, the process described above is repeated to introduce silane and phosphine into the chamber.

The invention claimed is:

1. A method of integrated circuit fabrication comprising:
   providing a chamber having an opening and no more than one tube extending into the chamber, each for delivery of a dopant gas and the opening separate from the tube; and
   placing at least one wafer in the chamber.

2. The method of claim 1 in which said wafer contains a layer of polysilicon and said dopant gas $PH_3$.

3. The method of claim 1 in which said chamber is approximately 84 inches long and said tube extends inward 34 inches±10% from the end of the chamber.

4. The method of claim 1 in which a plurality of wafers is placed in said chamber, said plurality of wafers comprising a wafer load of six boats; the center of said wafer load being 5½ inches±10% from the center of said chamber toward said tube.

5. A method of integrated circuit manufacture comprising:
   providing a chamber including:
      a chamber wall having an opening, and
      a tube extending through the chamber wall into the chamber, the opening being separate from the tube;
   placing at least one wafer in the chamber; and
   delivering a dopant into the chamber via the opening and the tube.

* * * * *